(12) United States Patent
Kim et al.

(10) Patent No.: US 10,854,294 B1
(45) Date of Patent: Dec. 1, 2020

(54) SEMICONDUCTOR MEMORY DEVICE HAVING PASS TRANSISTORS

(71) Applicant: SK hynix Inc., Icheon-si (KR)

(72) Inventors: Jin Ho Kim, Hwaseongsi (KR); Jeong Hwan Kim, Hwaseong-si (KR); Sang Hyun Sung, Cheongju-si (KR); Sung Lae Oh, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/723,268

(22) Filed: Dec. 20, 2019

(30) Foreign Application Priority Data

Jul. 5, 2019 (KR) .................. 10-2019-0081569

(51) Int. Cl.
G11C 16/08 (2006.01)
G11C 16/10 (2006.01)
G11C 16/30 (2006.01)
H01L 27/1157 (2017.01)
H01L 27/11524 (2017.01)
H01L 27/11565 (2017.01)
H01L 27/11519 (2017.01)

(52) U.S. Cl.
CPC .............. G11C 16/08 (2013.01); G11C 16/10 (2013.01); G11C 16/30 (2013.01); H01L 27/1157 (2013.01); H01L 27/11519 (2013.01); H01L 27/11524 (2013.01); H01L 27/11565 (2013.01)

(58) Field of Classification Search
CPC ......... G11C 16/08; G11C 16/10; G11C 16/30; H01L 27/1157
USPC ........................................................... 365/63
See application file for complete search history.

(56) References Cited

U.S. PATENT DOCUMENTS 5,187,555 A 2/1993 Kuroda et al.
10,388,663 B2 * 8/2019 Oh .................... H01L 27/11526
10,580,461 B2 * 3/2020 Kim ..................... G11O 5/066

FOREIGN PATENT DOCUMENTS

JP 2008-227198 A 9/2008
KR 1996-0001178 B 1/1996

* cited by examiner

Primary Examiner — Son L Mai

(57) ABSTRACT

A semiconductor memory device includes a plurality of memory cell arrays accessed through a plurality of row lines and a plurality of bit lines; a pass transistor coupled to one of the plurality of row lines and configured to transfer an operating voltage to the one of the plurality of row lines; and a plurality of wiring lines disposed in a wiring line layer over the pass transistor. The wiring line layer includes a wiring inhibition interval which overlaps a source and a drain of the pass transistor. One or more of the plurality of wiring lines is disposed outside of the wiring inhibition interval.

21 Claims, 19 Drawing Sheets

\* Permit only Vpass in wiring inhibition interval ZR

\* Inhibit LDSL and LSSL in wiring inhibition interval ZR

\* Inhibit $LWL_{n+2}$, $LWL_{n+1}$, $LWL_{n-1}$, $LWL_{n-2}$ in wiring inhibition interval ZR

SEMICONDUCTOR MEMORY DEVICE HAVING PASS TRANSISTORS

CROSS-REFERENCE TO RELATED APPLICATION

The present application claims priority under 35 U.S.C. § 119 from Korean Patent Application No. 10-2019-0081569 filed in the Korean Intellectual Property Office on Jul. 5, 2019, which is incorporated herein by reference in its entirety.

BACKGROUND

1. Technical Field

Various embodiments generally relate to a semiconductor memory device, and more particularly, to a semiconductor memory device having pass transistors.

2. Related Art

A semiconductor memory device is a memory device which is realized using a semiconductor such as silicon (Si), germanium (Ge), gallium arsenide (GaAs) and indium phosphide (InP). A semiconductor memory device is generally classified into a volatile memory device and a nonvolatile memory device.

A volatile memory device is a memory device which loses data stored therein when power supply is interrupted. Examples of volatile memory devices include an SRAM (static RAM), a DRAM (dynamic RAM) and an SDRAM (synchronous DRAM). A nonvolatile memory device is a memory device which retains data stored therein even when power supply is interrupted. Examples of nonvolatile memory devices include a ROM (read only memory), a PROM (programmable ROM), an EPROM (electrically programmable ROM), an EEPROM (electrically erasable and programmable ROM), a flash memory device, a PRAM (phase-change RAM), an MRAM (magnetic RAM), an RRAM (resistive RAM), and an FRAM (ferroelectric RAM).

NAND flash memory devices are widely used as nonvolatile memory devices. Memory cells of the NAND flash memory device may be provided with operating voltages necessary to read and output data stored in the memory cells through pass transistors.

SUMMARY

In an embodiment, a semiconductor memory device may include: a plurality of memory cell arrays accessed through a plurality of row lines and a plurality of bit lines; a pass transistor coupled to one of the plurality of row lines and configured to transfer an operating voltage to the one of the plurality of row lines; and a plurality of wiring lines disposed in a wiring line layer over the pass transistor. The wiring line layer may include a wiring inhibition interval which overlaps a source and a drain of the pass transistor. One or more of the plurality of wiring lines is disposed outside of the wiring inhibition interval.

In an embodiment, a semiconductor memory device may include: a memory structure disposed on a first substrate, and including a plurality of memory cell arrays which are accessed through a plurality of row lines and a plurality of bit lines; and a logic structure disposed on a second substrate, and including a logic circuit which includes a pass transistor coupled to one of the plurality of row lines and transferring an operating voltage to the one of the plurality of row lines and a plurality of wiring lines disposed in a wiring line layer over the logic circuit. The wiring line layer may include a wiring inhibition interval which overlaps with a source and a drain of the pass transistor and excludes at least one of the wiring lines.

DETAILED DESCRIPTION

Figure 1:
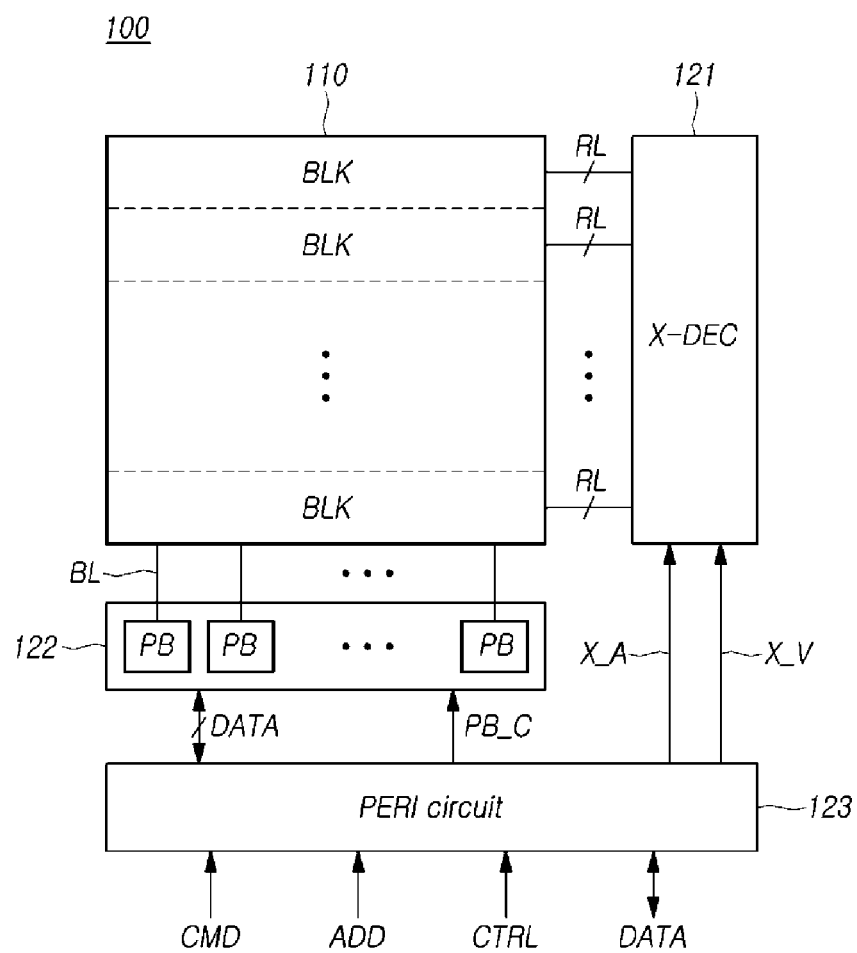
FIG. 1 is a block diagram illustrating an example of a semiconductor memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein, but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist or the clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun, (e.g. "a," "an," "the") the article may include a plural of that noun unless specifically stated otherwise.

Embodiments of the disclosure should be interpreted as including error margins even in the absence of explicit statements.

Also, in describing the components of the disclosure, there may be terms used like first, second, A, B, (a), and (b). These are solely for the purpose of differentiating one component from the other, and do not imply or suggest the substances, order, sequence or number of the components. Also, elements in embodiments of the disclosure are not limited by these terms. These terms are used to merely distinguish one element from another. Accordingly, as used herein, a first element may be a second element within the technical idea of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," another element C may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

Hereinafter, a semiconductor memory device will be described below in detail with reference to the accompanying drawings through various examples of embodiments of the disclosure.

FIG. 1 is a block diagram illustrating an example of a semiconductor memory device in accordance with an embodiment of the disclosure.

Referring to FIG. 1, a semiconductor memory device 100 in accordance with an embodiment of the disclosure may include a memory cell array 110, a row decoder (X-DEC) 121, a page buffer circuit 122 and a peripheral circuit (PERI circuit) 123.

The memory cell array 110 may include a plurality of memory blocks BLK. While not illustrated, each of the memory blocks BLK may include a plurality of cell strings. Each cell string may include at least one drain select transistor, a plurality of memory cells and at least one source select transistor, all coupled together in series. Each memory cell may be a volatile memory cell or may be a nonvolatile memory cell. While the descriptions below use a vertical NAND flash device as an example of the semiconductor memory device 100, it is to be understood that the technical spirit of the present disclosure is not limited thereto.

The memory cell array 110 may be coupled to the row decoder 121 through row lines RL. The row lines RL may include at least one drain select line, a plurality of word lines and at least one source select line. The memory cell array 110 may be coupled to the page buffer circuit 122 through bit lines BL.

The row decoder 121 may select any one, among the memory blocks BLK included in the memory cell array 110, in response to a row address X_A provided from the peripheral circuit 123. The row decoder 121 may transfer an operating voltage X_V, provided from the peripheral circuit 123, to row lines RL coupled to a memory block BLK selected from among the memory blocks BLK included in the memory cell array 110.

The page buffer circuit 122 may include a plurality of page buffers PB which are coupled to the bit lines BL, respectively. The page buffer circuit 122 may receive a page buffer control signal PB_C from the peripheral circuit 123, and may transmit and receive a data signal DATA to and from the peripheral circuit 123. The page buffer circuit 122 may control the bit lines BL, which are arranged in the memory cell array 110, in response to the page buffer control signal PB_C. For example, the page buffer circuit 122 may detect data stored in a memory cell of the memory cell array 110 by sensing the signal of a bit line BL of the memory cell array 110 in response to the page buffer control signal PB_C, and may transmit the data signal DATA to the peripheral circuit 123 depending on the detected data. The page buffer circuit 122 may apply a signal to a bit line BL based on the data signal DATA received from the peripheral circuit 123 in response to the page buffer control signal PB_C, and thereby, may write data in a memory cell of the memory cell array 110. The page buffer circuit 122 may write data in or read data from memory cells which are coupled to an activated word line, based on the page buffer control signal PB_C from the peripheral circuit 123.

The peripheral circuit 123 may receive a command signal CMD, an address signal ADD and a control signal CTRL from a device outside the semiconductor memory device 100, for example, a memory controller, and may transmit and receive data DATA to and from the device outside the semiconductor memory device 100. The peripheral circuit 123 may output signals for writing data in the memory cell array 110 or reading data from the memory cell array 110, for example, the row address X_A, the page buffer control signal PB_C and so forth, based on the command signal CMD, the address signal ADD and the control signal CTRL. The peripheral circuit 123 may generate various voltages, including the operating voltage X_V, that are required in the semiconductor memory device 100.

Hereinbelow, in the accompanying drawings, two directions that are parallel to the top surface of a substrate and intersect with each other are defined as a first direction FD and a second direction SD, respectively, and a direction that vertically protrudes from the top surface of the substrate is defined as a third direction TD. For example, the first direction FD may correspond to the extending direction of word lines, and the second direction SD may correspond to the extending direction of bit lines. The first direction FD and the second direction SD may substantially perpendicularly intersect with each other. The third direction TD may correspond to a direction that is perpendicular to the first direction FD and the second direction SD. In the following descriptions, the term 'vertical' or 'vertical direction' will be used as substantially the same meaning as the third direction TD. In the drawings, a direction indicated by an arrow and a direction opposite thereto represents the same direction.

Figure 2:
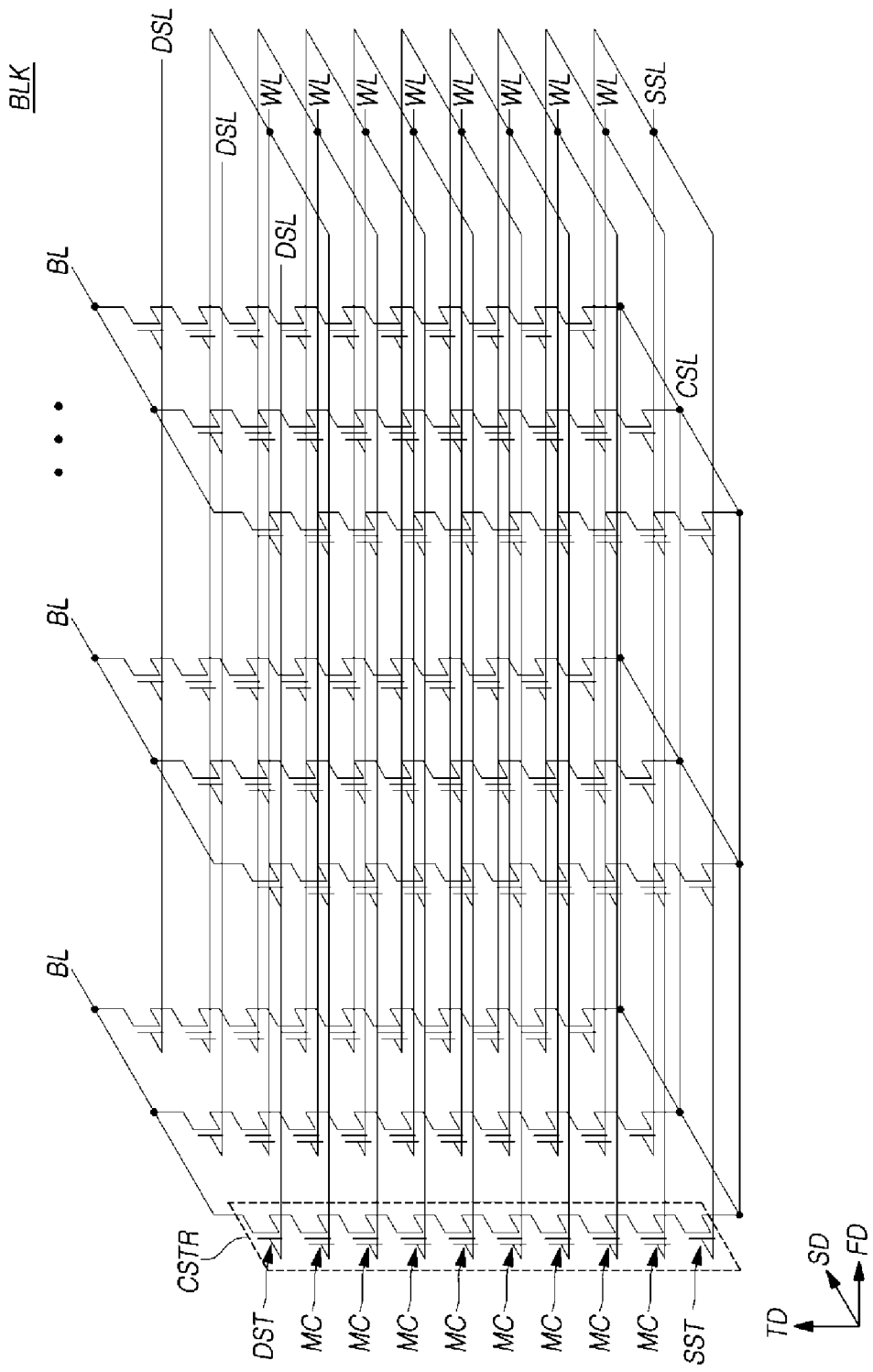
FIG. 2 is an equivalent circuit diagram illustrating an example of a memory block illustrated in FIG. 1 in accordance with an embodiment of the disclosure.

FIG. 2 is an equivalent circuit diagram illustrating an example of one of the memory blocks BLK illustrated in FIG. 1 in accordance with an embodiment of the disclosure.

Referring to FIG. 2, the memory block BLK may include a plurality of cell strings CSTR which are coupled between a plurality of bit lines BL and a common source line CSL.

The bit lines BL may extend in the second direction SD, and may be arranged in the first direction FD. A plurality of cell strings CSTR may be coupled in parallel to each of the bit lines BL. The cell strings CSTR may be coupled in common to the common source line CSL. The plurality of cell strings CSTR may be disposed between the plurality of bit lines BL and the one common source line CSL.

Each of the cell strings CSTR may include a drain select transistor DST which is coupled to a bit line BL, a source select transistor SST which is coupled to the common source line CSL, and a plurality of memory cells MC which are coupled between the drain select transistor DST and the source select transistor SST. The drain select transistor DST, the memory cells MC and the source select transistor SST may be coupled in series in the third direction TD.

Drain select lines DSL, a plurality of word lines WL and source select lines SSL may be disposed in the third direction TD between the bit lines BL and the common source line CSL. The drain select lines DSL may be coupled to the gates of corresponding drain select transistors DST, respectively. The word lines WL may be coupled to the gates of corresponding memory cells MC, respectively. The source select lines SSL may be coupled to the gates of source select transistors SST. Memory cells MC, which are coupled in common to one word line WL, may constitute one page.

Figure 3:
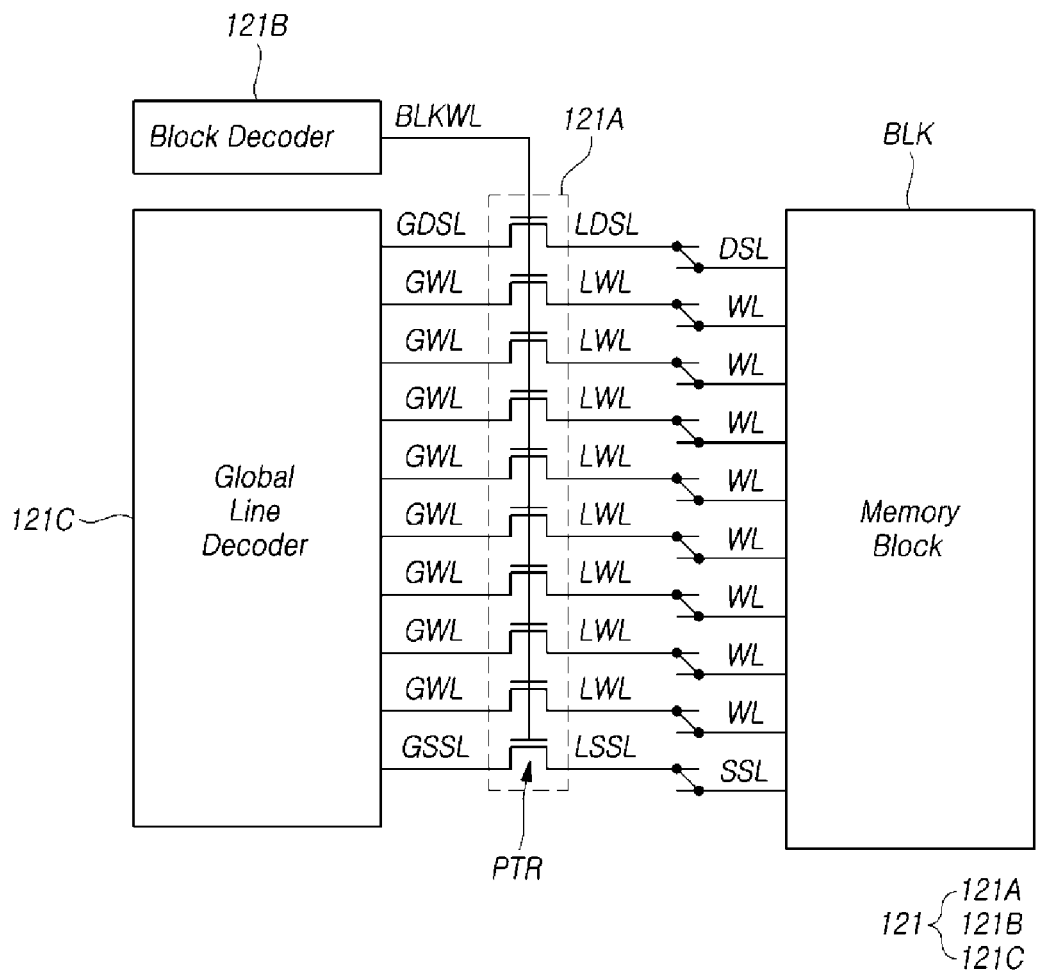
FIG. 3 is a block diagram illustrating a memory block and a row decoder illustrated in FIG. 1 in accordance with an embodiment of the disclosure.

FIG. 3 is a block diagram illustrating an example of the memory block and the row decoder of the semiconductor memory device 100 in accordance with an embodiment of the disclosure.

Referring to FIG. 3, the row decoder 121 may include a pass transistor circuit 121A, a block decoder 121B and a global line decoder 121C.

The pass transistor circuit 121A may be provided for each memory block BLK. The block decoder 121B and the global line decoder 121C may be provided in common for a plurality of memory blocks BLK included in the memory cell array 110 (see FIG. 1).

The pass transistor circuit 121A may be coupled to a plurality of row lines DSL, WL and SSL through local row lines LDSL, LWL and LSSL respectively. The local row lines LDSL, LWL and LSSL may include at least one local drain select line LDSL, a plurality of local word lines LWL and at least one local source select line LSSL. The local drain select line LDSL may be coupled to the drain select line DSL. The local word lines LWL may be coupled to the word lines WL, respectively. The local source select line LSSL may be coupled to the source select line SSL.

The pass transistor circuit 121A may include a plurality of pass transistors PTR. Global row lines GDSL, GWL and GSSL may be coupled to the drains of the pass transistors PTR, respectively, and the local row lines LDSL, LWL and LSSL may be coupled to the sources of the pass transistors PTR, respectively. The global row lines GDSL, GWL and GSSL may include at least one global drain select line GDSL, a plurality of global word lines GWL and at least one global source select line GSSL.

The block decoder 121B may be coupled to the pass transistor circuit 121A through a block word line BLKWL. The block decoder 121B may be provided with a block select signal from the peripheral circuit 123 (see FIG. 1), and may transfer the block select signal to the block word line BLKWL in response to a control signal from the peripheral circuit 123.

The global line decoder 121C may be coupled to the pass transistor circuit 121A through the global row lines GDSL, GWL and GSSL. The global line decoder 121C may be provided with operating voltages from the peripheral circuit 123 (see FIG. 1), and may transfer the operating voltages to the global row lines GDSL, GWL and GSSL in response to a control signal from the peripheral circuit 123.

The pass transistors PTR may couple the global row lines GDSL, GWL and GSSL and the local row lines LDSL, LWL and LSSL in response to the block select signal of the block word line BLKWL. The pass transistors PTR may transfer the operating voltages applied to the global row lines GDSL, GWL and GSSL, to the local row lines LDSL, LWL and LSSL, and accordingly, may provide the operating voltages to the row lines DSL, WL and SSL of the memory block BLK.

Figure 4:
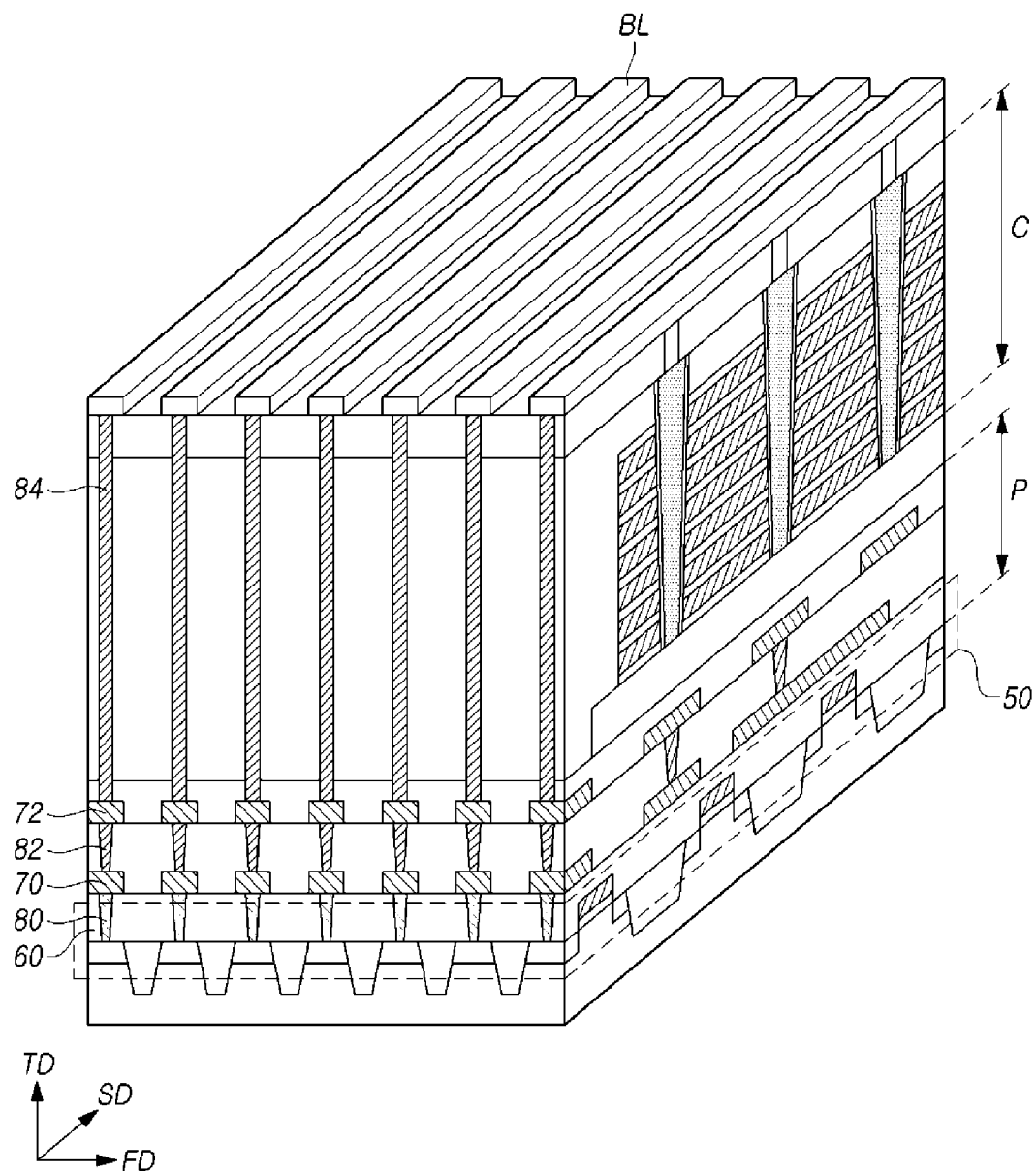
FIG. 4 is a perspective view illustrating an example of a portion of a semiconductor memory device in relation to an embodiment of the disclosure.

FIG. 4 is a perspective view illustrating an example of a portion of a semiconductor memory device in relation to an embodiment of the disclosure.

Referring to FIG. 4, a plurality of bit lines BL may be disposed over a memory structure C. The bit lines BL may extend in the second direction SD, and may be repeatedly disposed at a predetermined pitch in the first direction FD.

The bit lines BL may be coupled to a logic circuit 50 of a logic structure P through contacts 84, second wiring lines 72, contacts 82, first wiring lines 70 and contacts 80.

As the degree of integration of a semiconductor memory device increases, the pitch and width of the bit lines BL are being reduced, and accordingly, the pitch and width of the first wiring lines 70 coupled to the bit lines BL are also being reduced. If the width of the first wiring lines 70 is reduced, the critical dimension (CD) of the contacts 80. which couple the first wiring lines 70 and the logic circuit 50, needs to be reduced. If the critical dimension (CD) of the contacts 80 is reduced without reducing the height of the contacts 80, then the aspect ratio of the contacts 80 increases, and thus, a not-open failure in which the bottom of a hole is not open in a hole etching process for forming the contacts 80 may occur. In order to prevent the not-open failure, the height of the contacts 80 needs to be reduced, and to this end, the thickness of a dielectric layer 60 also needs to be reduced.

As is well known in the art, if a program voltage Vpgm which is supplied to a memory cell in a program operation is low, a rise in the threshold voltage of the memory cell may decrease, and result in a slow cell with a threshold voltage lower than that of a normal cell.

If the thickness of the dielectric layer 60 is reduced, because the coupling capacitances between pass transistors included in the logic circuit 50 and the first wiring lines 70 increase, the level of the program voltage Vpgm provided to memory cells through the pass transistors may decrease, and accordingly, a slow cell with a degraded cell distribution characteristic may result. That is to say, a slow failure may be caused.

Figure 5:
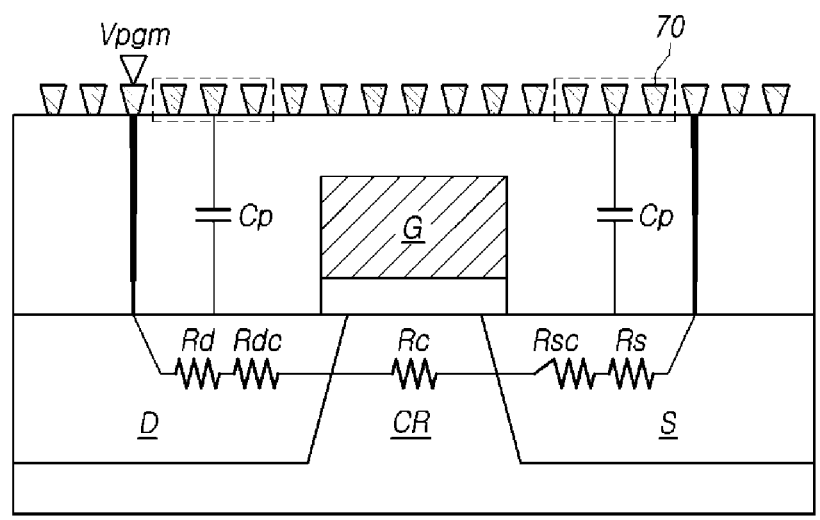
FIG. 5 is a diagram illustrating an example of coupling capacitances and parasitic resistance components of a pass transistor in relation to an embodiment of the disclosure.

FIG. 5 is a diagram illustrating an example of coupling capacitances and parasitic resistance components of a pass transistor.

Referring to FIG. 5, if the program voltage Vpgm is applied to a drain D of a pass transistor, coupling capacitances Cp may be generated by the voltage level difference between a voltage loaded to the first wiring lines 70 disposed over the drain D and a source S of the pass transistor, and between a voltage of the drain D and the source S of the pass transistor. Due to the coupling capacitances Cp, parasitic resistance components Rdc and Rsc may be generated between a channel region CR below a gate G and the drain D and between the channel region CR and the source S, respectively. Reference symbol Rd denotes a specific resistance of the drain D, Rs a specific resistance of the source S, and Rc a specific resistance of the channel region CR.

The program voltage Vpgm applied to the drain D of the pass transistor may sharply decrease due to the parasitic resistance of components Rdc and Rsc while being transferred to the source S through the channel region CR, and accordingly, as the program voltage Vpgm of a low level is provided to a memory cell, a slow failure may be caused.

Embodiments of the disclosure include semiconductor memory devices capable of suppressing slow failures and improving cell voltage distribution characteristic.

Figure 6:
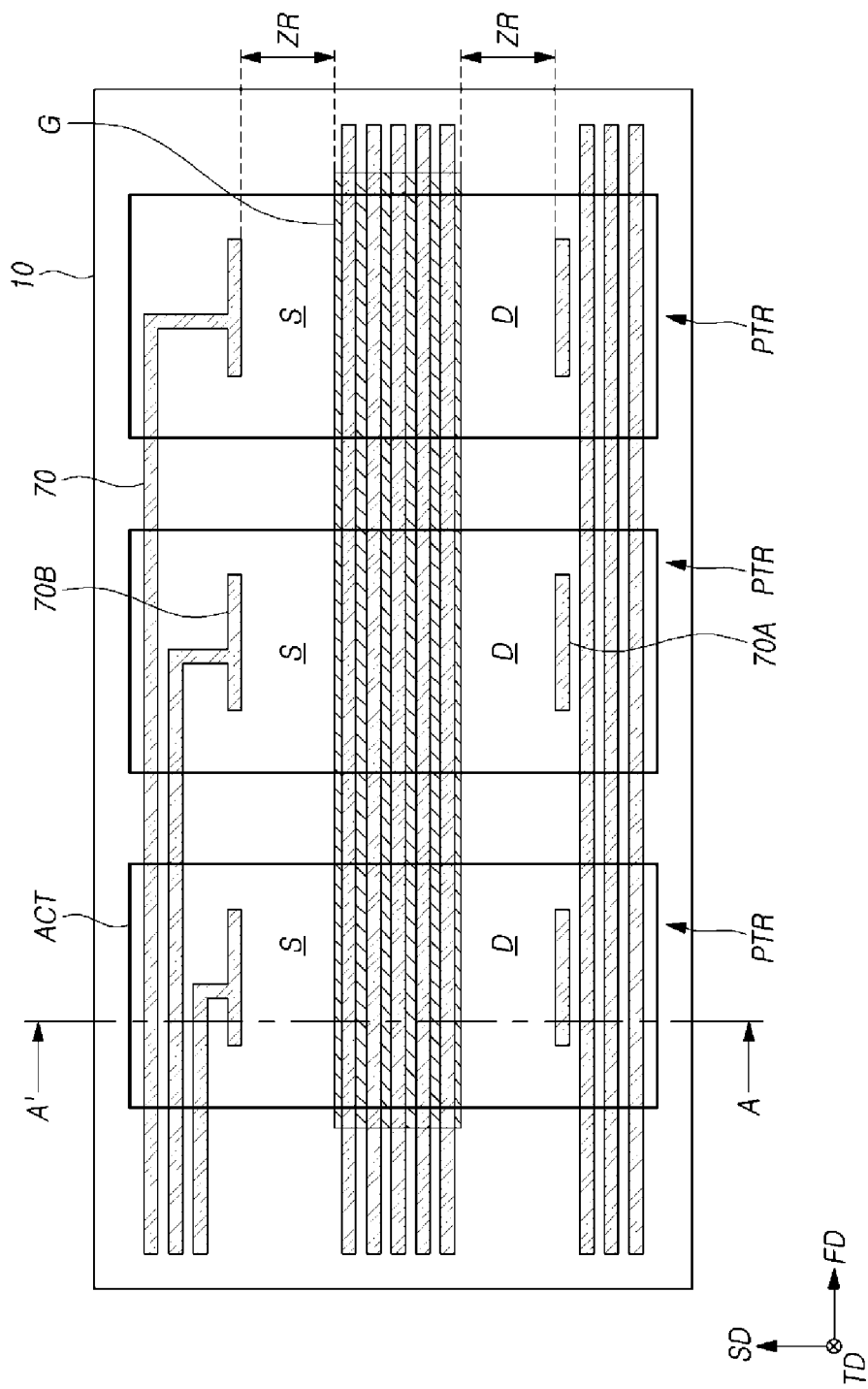
FIG. 6 is a top view illustrating an example of a semiconductor memory device in accordance with an embodiment of the disclosure.
Figure 7:
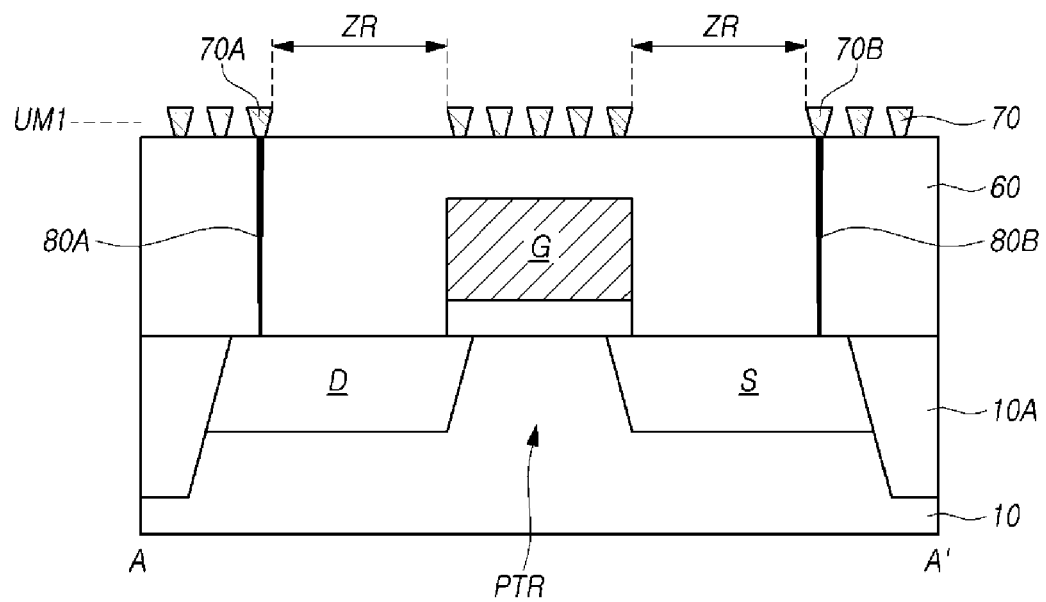
FIG. 7 is a cross-sectional view taken along the line A-A' of FIG. 6 in accordance with an embodiment of the disclosure.

FIG. 6 is a top view illustrating an example of a portion of a semiconductor memory device in accordance with embodiments of the disclosure, and FIG. 7 is a cross-sectional view taken along the line A-A' of FIG. 6.

Referring to FIG. 6, a plurality of active regions ACT may be disposed in a substrate 10 and spaced apart in the first direction FD. A gate G may be disposed on the substrate 10, extending in the first direction FD while traversing the active regions ACT. Sources S and drains D may be defined or disposed in the active regions ACT on both sides of the gate G. The gate G and the source S and the drain D on both sides of the gate G may collectively constitute a pass transistor PTR of an active region ACT.

Referring to FIGS. 6 and 7, a dielectric layer 60 may be defined on or disposed over or directly on the substrate 10 to cover the pass transistors PTR. First wiring lines 70 and first and second pads 70A and 70B may be defined or disposed on the dielectric layer 60, thereby constituting a first wiring line layer UM1. The first wiring lines 70 may extend in the first direction FD substantially parallel to the gate G extending in the same direction. Referring to FIG. 6, the first pads 70A may overlap with the drains D of the pass transistors PTR in the third direction TD, and the second pads 70B may overlap with the sources S of the pass transistors PTR, in the third direction TD.

First contacts 80A, which pass through the dielectric layer 60, may be defined or disposed on the drains D of the respective pass transistors PTR, thereby coupling the drains D and the first pads 70A. Second contacts 80B, which pass through the dielectric layer 60, may be defined or disposed on the sources S of the respective pass transistors PTR, thereby coupling the sources S and the second pads 70B.

Referring to FIG. 6, the first wiring lines 70 may be coupled to the second pads 70B. The first wiring lines 70 may constitute the local row lines LDSL, LWL and LSSL (see FIG. 3). Although the present embodiment illustrates a case in which the first wiring lines 70 are the local row lines LDSL, LWL and LSSL (see FIG. 3), it is to be noted that the technical spirit of the disclosure is not limited thereto.

A wiring inhibition interval ZR may be included in the first wiring line layer UM1. The wiring inhibition interval ZR may be an interval in the first wiring line layer UM1 that excludes or includes a substitute for at least one of the first wiring lines 70. The wiring inhibition interval ZR may be an interval or area in the first wiring line layer UM1 that overlaps with the drain D and the source S between the first contact 80A and the second contact 80B. The wiring inhibition interval ZR may extend in the second direction SD and the first direction FD.

In an embodiment, the wiring inhibition interval ZR does not overlap with the gate G. Therefore, referring to FIG. 7, the wiring inhibition interval ZR may be defined or disposed as an interval between one sidewall of the gate G adjacent to the drain D and the first contact 80A, and an interval between the other sidewall of the gate G adjacent to the source S and the second contact 80B. The first wiring lines 70 may be disposed in the first wiring line layer UM1 outside the wiring inhibition interval ZR. The first wiring lines 70 may not be disposed within in the wiring inhibition interval ZR.

The positions of the wiring inhibition interval ZR and the first wiring lines 70 are not limited to the embodiment described above with reference to FIGS. 6 and 7, and may be changed variously. Non-limiting examples of different configurations are described below.

Figure 12:
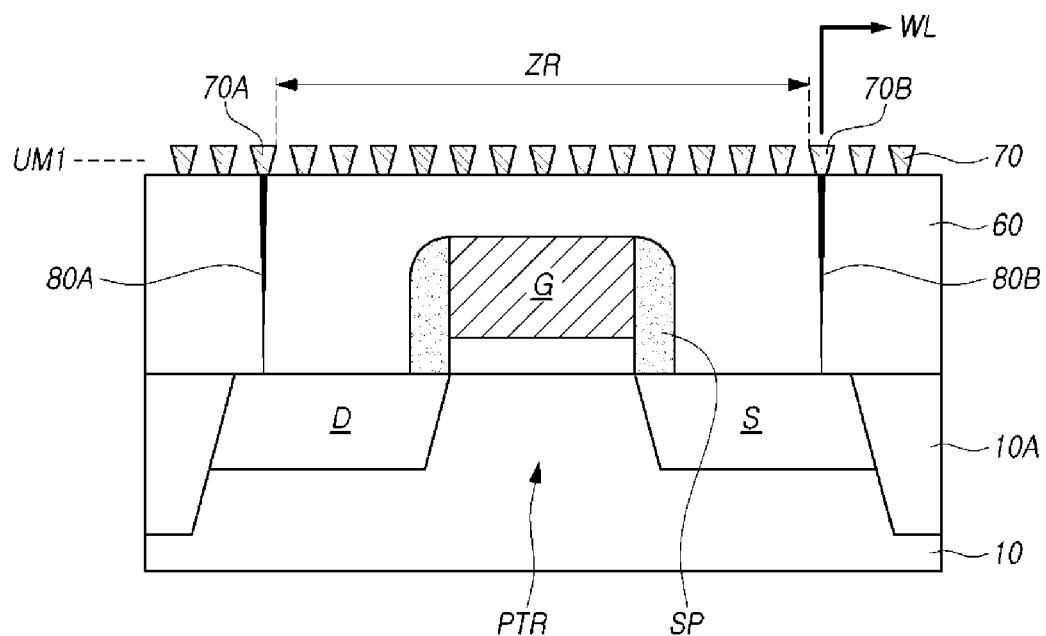
Figure 13:
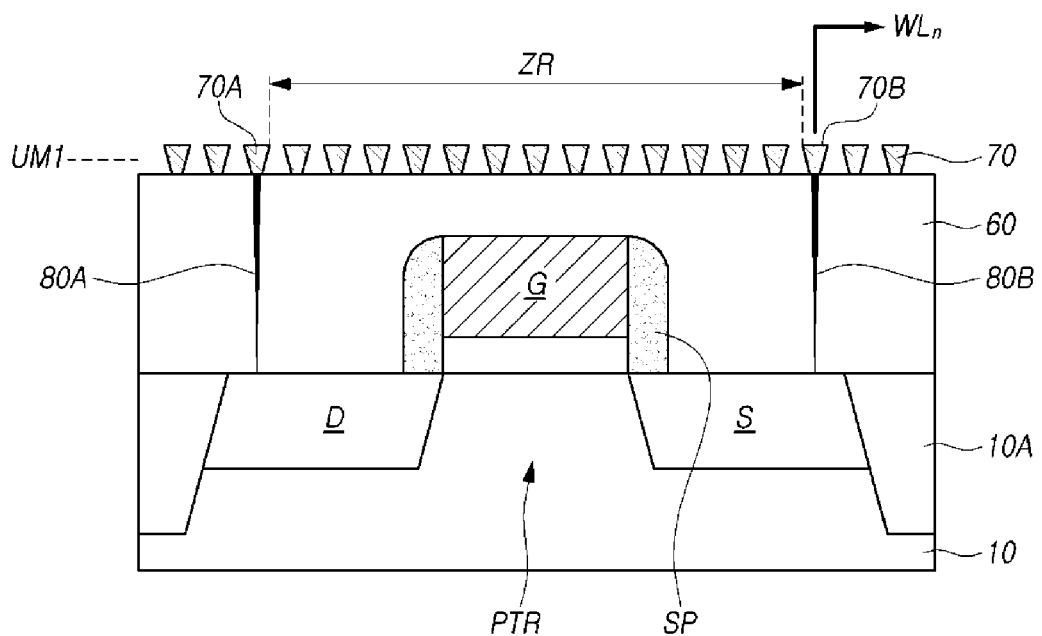
Figure 14:
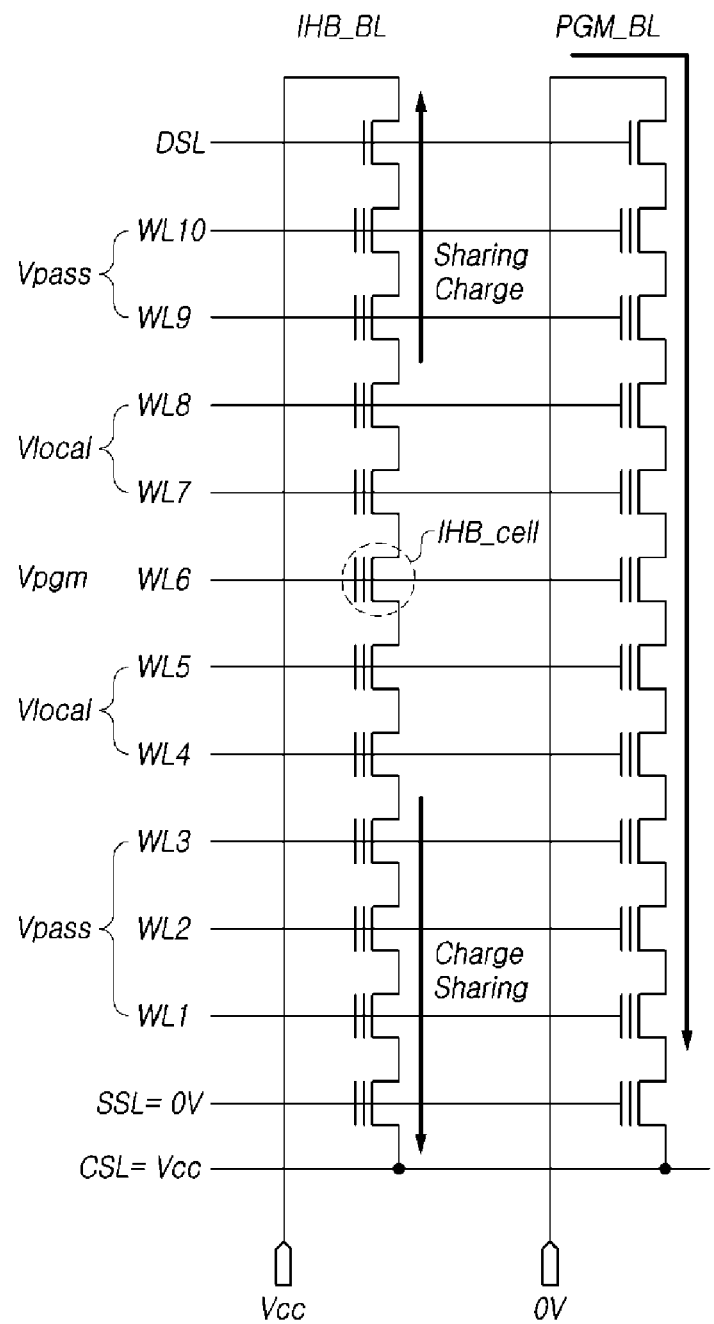
FIG. 14 is a diagram to explaining e an operation of a semiconductor memory device in relation to embodiments of the disclosure.

FIGS. 8 to 13 are cross-sectional illustrating examples of portions of semiconductor memory devices in accordance with embodiments of the disclosure, and FIG. 14 is a diagram explaining an operation of a semiconductor memory device in relation to embodiments of the disclosure. It will be understood by those in the art that methods of operating a semiconductor memory device are also disclosed in FIGS. 6-14 and the descriptions herein to suppress slow failures and improving cell voltage distribution characteristic, thereby improving the function of the memory devices.

Figure 8:
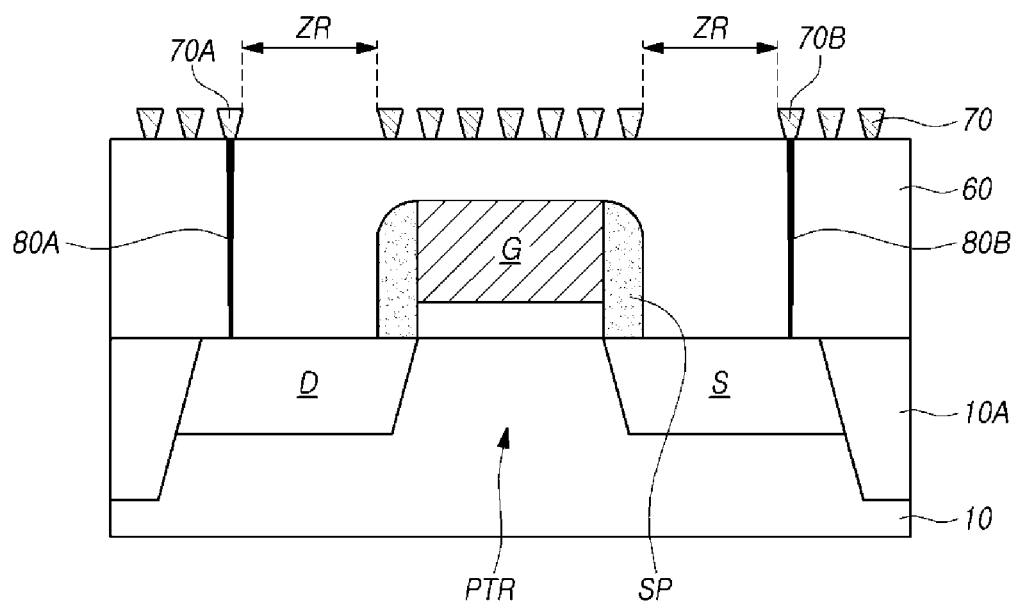
FIGS. 8 to 13 are cross-sectional views illustrating examples of semiconductor memory devices in accordance with embodiments of the disclosure.

Referring to FIG. 8, a gate spacer SP may be defined or disposed on sidewalls of the gate G of a pass transistor PTR. In the first wiring line layer UM1, the wiring inhibition interval ZR may overlap with the drain D and the source S, and not overlap with the gate G and the gate spacer SP defined/disposed on both side of the gate G, between the first contact 80A and the second contact 80B. Thus, the wiring inhibition interval ZR may be defined or disposed as an interval between the gate spacer SP defined or disposed on one sidewall of the gate G adjacent to the drain D and the first contact 80A, and as an interval between the gate spacer SP defined or disposed on the other sidewall of the gate G adjacent to the source S and the second contact 80B. The first wiring lines 70 may be disposed in the first wiring line layer UM1 outside of the wiring inhibition interval ZR. The first wiring lines 70 may not be disposed in the wiring inhibition interval ZR.

Figure 9:
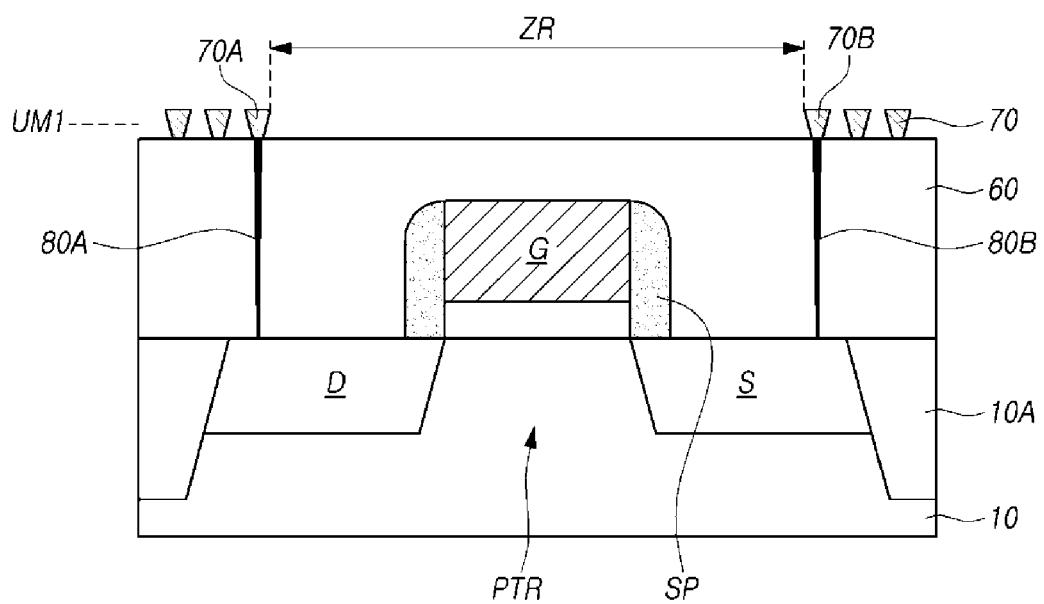

Referring to FIG. 9, the wiring inhibition interval ZR may overlap with the drain D, the source S, the gate G and the gate spacer SP defined/disposed on both side of the gate G, between the first contact 80A and the second contact 80B. The wiring inhibition interval ZR may be defined or disposed as an interval between the first contact 80A and the second contact 80B. The first wiring lines 70 may be disposed outside the wiring inhibition interval ZR. The first wiring lines 70 may not be disposed in the wiring inhibition interval ZR.

Figure 10A:
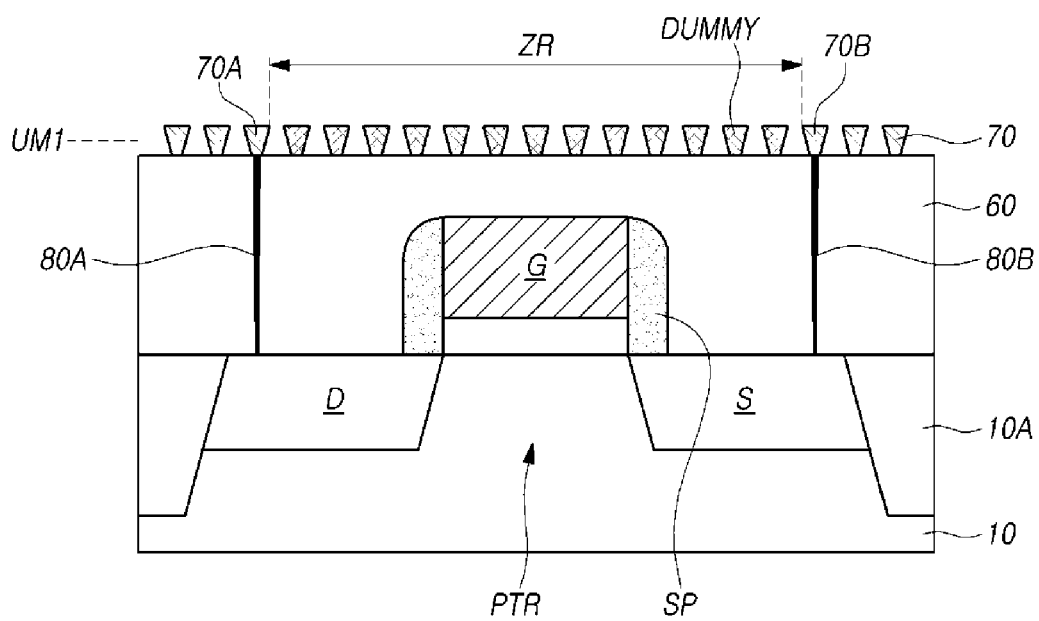

Referring to FIG. 10*a*, the first wiring lines 70 may be disposed outside the wiring inhibition interval ZR. The first wiring lines 70 may not be disposed in the wiring inhibition interval ZR. The first wiring lines 70 may be formed by forming a conductive layer on the dielectric layer 60, and then patterning the conductive layer using a photolithography process and an etching process.

In the wiring inhibition interval ZR, dummy wiring lines DUMMY may be disposed in the first wiring line layer UM1. The dummy wiring lines DUMMY may always be floated in any given operation of a semiconductor memory device, and may exert no influence on the operation of the semiconductor memory device. The dummy wiring lines DUMMY may be formed through the same processes as those used to form as the first wiring lines 70.

A pattern density of the dummy wiring lines DUMMY may be substantially the same as a pattern density of the first wiring lines 70. Due to the presence of the dummy wiring lines DUMMY, a pattern density inside the wiring inhibition interval ZR and a pattern density outside the wiring inhibition interval ZR may be substantially uniform. Therefore, loading differences due to pattern density differences may be reduced by using or controlling photolithography processes and etching processes for forming the first wiring line layer UM1, thereby suppressing a defect in the profile or characteristics of the first wiring lines 70.

Figure 10B:
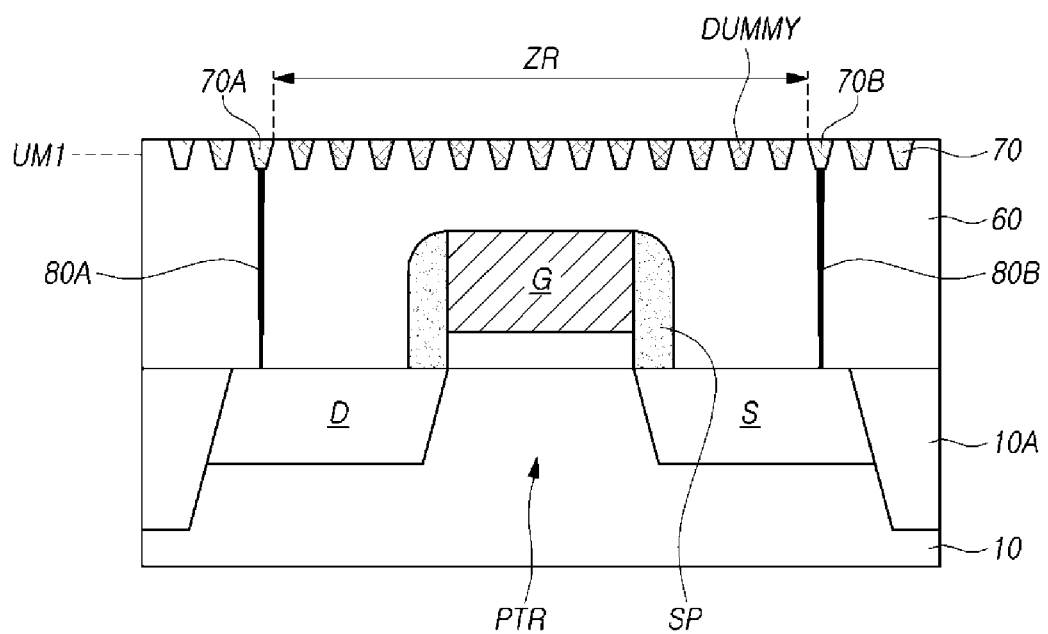

Referring to FIG. 10b, the first wiring lines 70 may be disposed, in dielectric layer 60, outside the wiring inhibition interval ZR. The first wiring lines 70 may not be disposed in the wiring inhibition interval ZR. The first wiring lines 70 may be formed by forming trench patterns on the top surface of the dielectric layer 60, forming a conductive layer to fill the trench patterns and then removing the conductive layer formed outside the trench patterns, through a polishing process.

In the wiring inhibition interval ZR, dummy wiring lines DUMMY may be disposed in the first wiring line layer UM1. The dummy wiring lines DUMMY may always be floated in any given operation of a semiconductor memory device, and may exert no influence on the operation of the semiconductor memory device. The dummy wiring lines DUMMY may be formed through the same processes as those used to form the first wiring lines 70.

A pattern density of the dummy wiring lines DUMMY may be substantially the same as a pattern density of the first wiring lines 70. Due to the presence of the dummy wiring lines DUMMY, a pattern density inside the wiring inhibition interval ZR and a pattern density outside the wiring inhibition interval ZR may be substantially uniform. Therefore, loading differences due to pattern density differences may be reduced by using or controlling polishing processes for forming the first wiring line layer UM1, thereby suppressing a defect such as a dishing.

Figure 11:
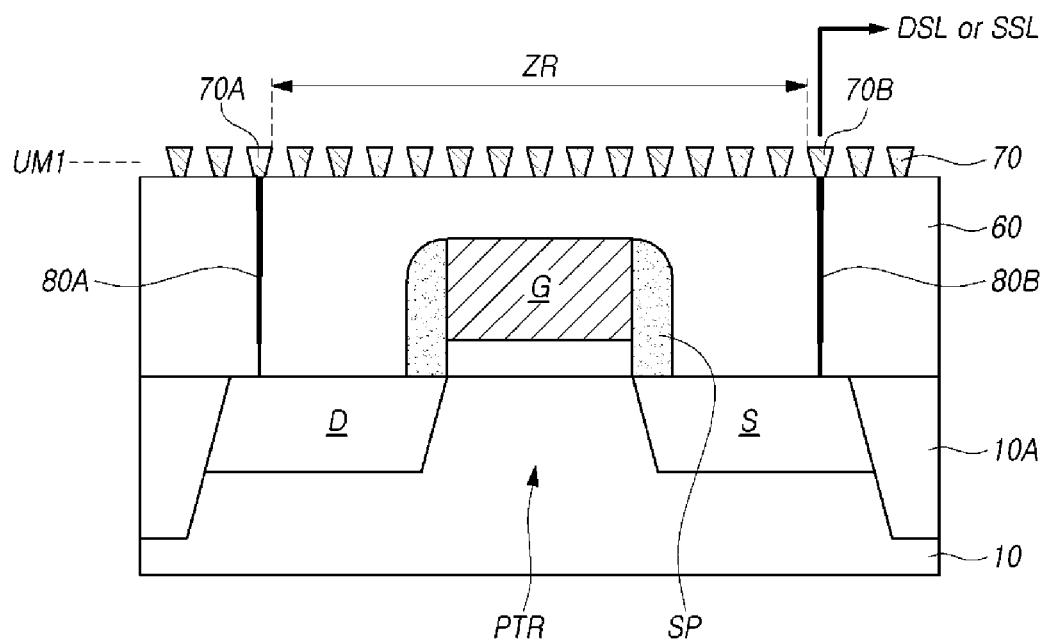

Referring to FIG. 11, the pass transistor PTR may play the role of transferring an operating voltage to a drain select line DSL. In this case, the second pad 70B coupled to the source S of the pass transistor PTR may be coupled to the drain select line DSL through wiring lines (not illustrated) and contacts (not illustrated).

The pass transistor PTR may also play the role of transferring an operating voltage to a source select line SSL. In this case, the second pad 70B coupled to the source S of the pass transistor PTR may be coupled to the source select line SSL through wiring lines (not illustrated) and contacts (not illustrated).

In the wiring inhibition interval ZR, only first wiring lines 70 to which a pass voltage Vpass is loaded, among all of the first wiring lines 70, may be permitted. First wiring lines 70 in the wiring inhibition interval ZR to which a voltage other than the pass voltage Vpass is loaded may be excluded.

In a program operation, a program voltage Vpgm may be provided to a selected word line WL, and the pass voltage Vpass higher than the program voltage Vpgm may be provided to an unselected word line WL. In the present embodiment, in the wiring inhibition interval ZR, by permitting only the disposition of first wiring lines 70 to which the pass voltage Vpass is loaded and by excluding the disposition of first wiring lines 70 to which a voltage other than the pass voltage Vpass is loaded, it is possible to maintain the level of the program voltage Vpgm applied to the pass transistor PTR in the program operation, and prevent or suppress such levels from decreasing and contributing to slow failures.

Referring to FIG. 12, the pass transistor PTR may play the role of transferring an operating voltage to a word line WL. In this case, the second pad 70B coupled to the source S of the pass transistor PTR may be coupled to the word line WL through wiring lines (not illustrated) and contacts (not illustrated).

In the wiring inhibition interval ZR, the disposition of first wiring lines 70 which are coupled to drain select lines and first wiring lines 70 which are coupled to source select lines may be inhibited or excluded. The first wiring lines 70 may include local drain select lines LDSL which are coupled to drain select lines, local word lines LWL which are coupled to word lines, and local source select lines LSSL which are coupled to source select lines. In the wiring inhibition interval ZR, the disposition of the local drain select lines LDSL and the local source select lines LSSL may be inhibited or excluded.

A program voltage Vpgm may be provided to the drain D of the pass transistor PTR which is coupled to a word line selected in a program operation, and a voltage lower than the program voltage Vpgm may be provided to the local drain select lines LDSL and the local source select lines LSSL. In the present embodiment, by inhibiting the disposition of the local drain select lines LDSL and the local source select lines LSSL in the wiring inhibition interval ZR, it is possible to suppress, reduce, inhibit or prevent reductions in the level of the program voltage Vpgm applied to the pass transistor PTR in the program operation.

Referring to FIG. 13, the pass transistor PTR may play the role of transferring an operating voltage to a word line WLn. In this case, the second pad 70B coupled to the source S of the pass transistor PTR may be coupled to the word line WLn through wiring lines (not illustrated) and contacts (not illustrated).

In the wiring inhibition interval ZR, the disposition of first wiring lines 70 which are coupled to word lines adjacent to the word line WLn coupled to the pass transistor PTR may be inhibited or excluded. For example, the disposition of local word lines LWLn+1 and LWLn+2 which are coupled to two upper word lines of the word line WLn coupled to the pass transistor PTR and local word lines LWLn−1 and LWLn−2 which are coupled to two lower word lines of the word line WLn coupled to the pass transistor PTR may be inhibited or excluded.

In a program operation, a local boosting scheme may be employed to prevent a program disturbance. Referring to FIG. 14, in the local boosting scheme, a program voltage Vpgm may be applied to a word line WL6 selected in a program operation, and a local voltage Vlocal lower than the program voltage Vpgm may be applied to upper word lines WL7 and WL8 and lower word lines WL4 and WL5 relative to the selected word line WL6. As the local voltage Vlocal is applied to the upper word lines WL7 and WL8 and the lower word lines WL4 and WL5, potential barriers may be formed at the word lines WL7, WL8, WL4 and WL5, and charge sharing paths may be blocked by the potential barriers. As a consequence, a program disturbance, being a phenomenon in which a program inhibition cell IHB_cell coupled to the selected word line WL6 is programmed, may be prevented.

In the embodiment illustrated in FIG. 13, because the local word lines LWLn+1, LWLn+2, LWLn−1 and LWLn−2 coupled to word lines WLn+1, WLn+2, WLn−1 and WLn−2 adjacent to the word line WLn coupled to the pass transistor PTR are inhibited or excluded from being disposed in the wiring inhibition interval ZR, it is possible to suppress, reduce, inhibit or prevent, in a program operation employing the local boosting scheme, the program voltage Vpgm applied to the pass transistor PTR from decreasing by the influence of the local voltage Vlocal loaded to the local word lines LWLn+2, LWLn+1, LWLn−1 and LWLn−2.

Figure 15:
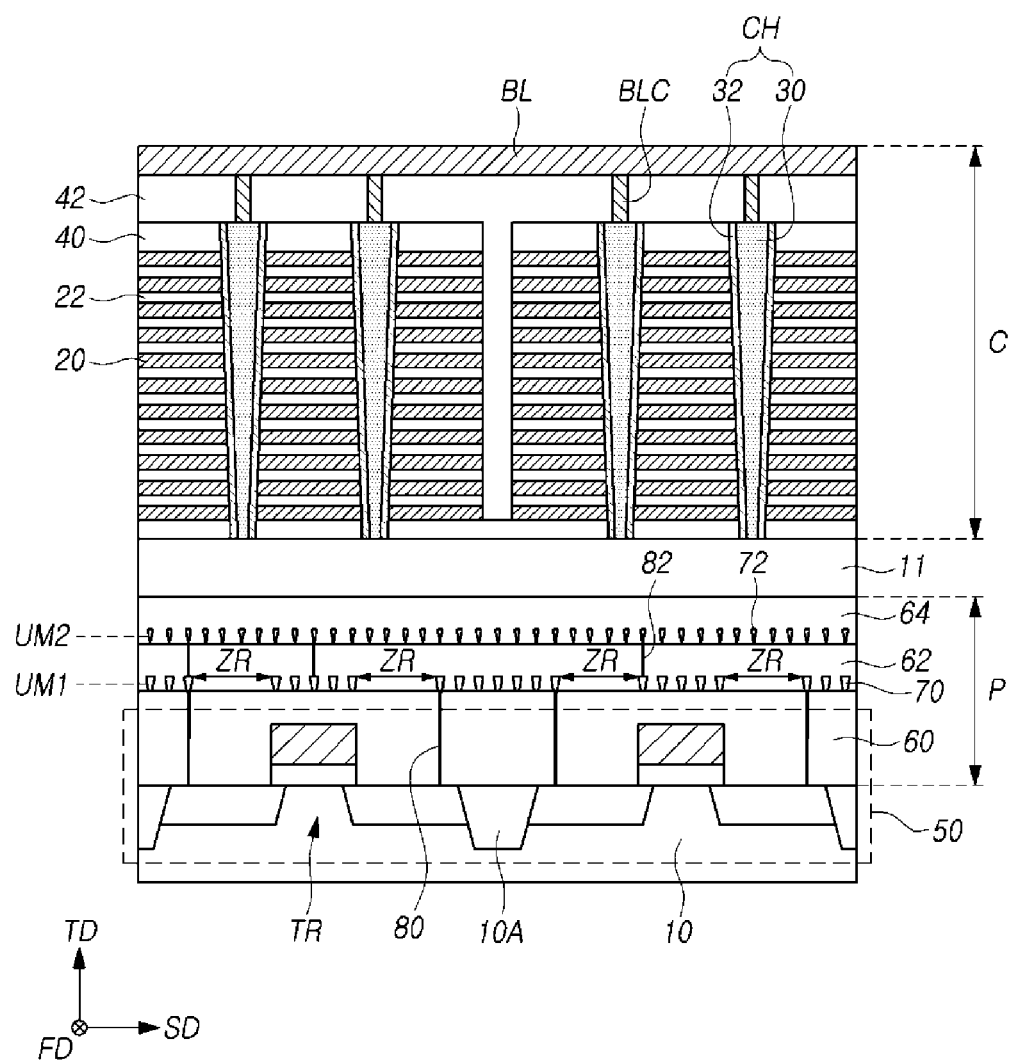
FIG. 15 is a cross-sectional view illustrating an example of a semiconductor memory device in accordance with an embodiment of the disclosure.

FIG. 15 is a cross-sectional view illustrating an example of a semiconductor memory device in accordance with embodiments of the disclosure.

Referring to FIG. 15, the semiconductor memory device may have a PUC (peri under cell) structure. A logic structure P may be disposed under a memory structure C.

The logic structure P may be disposed on a substrate 10. The memory structure C may be disposed on a source plate 11. The substrate 10 may include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer. The source plate 11 may be constituted by a polysilicon layer. Unlike the substrate 10 which may use a monocrystalline silicon layer, because the source plate 11 is formed or disposed on the logic structure P, the source plate 11 may be constituted by a polysilicon layer.

The memory structure C may include vertical channels CH which are disposed on the source plate 11, and a plurality of electrode layers 20 and a plurality of interlayer dielectric layers 22, alternately stacked along the vertical channels CH.

The electrode layers 20 may constitute the row lines DSL, WL and SSL described above with reference to FIG. 3. Among the electrode layers 20, at least one layer from the lowermost may constitute the source select line SSL, and at least one layer from the uppermost may constitute the drain select line DSL. The electrode layers 20 between the source select line SSL and the drain select line DSL may constitute the plurality of word lines WL.

The electrode layers 20 may include a conductive material. For example, the electrode layers 20 may include at least one selected among a doped semiconductor (e.g., doped silicon), a metal (e.g., tungsten, copper or aluminum), conductive metal nitride (e.g., titanium nitride or tantalum nitride) and a transition metal (e.g., titanium or tantalum). The interlayer dielectric layers 22 may include silicon oxide.

The vertical channels CH may be coupled to the source plate 11 through the electrode layers 20 and the interlayer dielectric layers 22. Each of the vertical channels CH may include a channel layer 30 and a gate dielectric layer 32. The channel layer 30 may include polysilicon or monocrystalline silicon, and may include a P-type impurity such as boron (B) in some regions thereof. The channel layer 30 may have a pillar-like or cylinder-like shape, and the channel layer 30 may be solid, i.e., completely filled in its center. While not illustrated, in other embodiments the channel layer 30 may have a tube-like shape with its central region is open or hollow. In this case, a buried dielectric layer may be formed in the open central region of the channel layer 30. The gate dielectric layer 32 may have the shape of a straw or a cylindrical shell which surrounds the outer wall of the channel layer 30. The gate dielectric layer 32 may include a tunnel dielectric layer, a charge storage layer and a blocking layer which are sequentially stacked in an inward direction from the outer sidewall of the channel layer 30. The tunnel dielectric layer may include silicon oxide, hafnium oxide, aluminum oxide, zirconium oxide or tantalum oxide. The charge storage layer may include silicon nitride, boron nitride, silicon boron nitride or polysilicon doped with an impurity. The blocking layer may include a single layer or a stack layer of silicon oxide, silicon nitride, hafnium oxide, aluminum oxide, zirconium oxide and tantalum oxide. In some embodiments, the gate dielectric layer 32 may have an ONO (oxide-nitride-oxide) stack structure in which an oxide layer, a nitride layer and an oxide layer are sequentially stacked. Source select transistors, memory cells and drain select transistors may be constituted where the electrode layers 20 surround the vertical channels CH.

A dielectric layer 40 may be defined or disposed on the source plate 11 to cover the source plate 11, the electrode layers 20 and the interlayer dielectric layers 22 and cover the side surfaces of the vertical channels CH. A dielectric layer 42 may be defined or disposed on the dielectric layer 40 to cover the top surfaces of the vertical channels CH. The dielectric layers 40 and 42 may include silicon oxide, for example, HDP (high density plasma) oxide or TEOS (tetra-ethyl-ortho-silicate) oxide.

A plurality of bit lines BL may be disposed on the dielectric layer 42. The bit lines BL may extend in the second direction SD, and may be disposed and spaced apart in the first direction FD.

Bit line contacts BLC which pass through the dielectric layer 42 may be defined or disposed under the bit lines BL to couple the bit lines BL and the channel layers 30 of the vertical channels CH.

The logic structure P may include a logic circuit 50, dielectric layers 60, 62 and 64, and wiring lines 70 and 72.

The logic circuit 50 may include transistors TR which are disposed on active regions of the substrate 10 defined or bounded by an isolation layer 10A. While not illustrated, the logic circuit 50 may further include capacitors, inductors, and so forth. The logic circuit 50 may constitute a row decoder 121, a page buffer circuit 122 and a peripheral circuit 123 of FIG. 1. The transistors TR may include pass transistors.

The dielectric layers 60, 62 and 64 may be defined or disposed on the substrate 10 to cover the logic circuit 50. The dielectric layers 60, 62 and 64 may include first to third dielectric layers 60, 62 and 64 which are sequentially stacked. The first to third dielectric layers 60, 62 and 64 may include silicon oxide, for example, HDP oxide or TEOS oxide.

A first wiring line layer UM1 may be disposed on the first dielectric layer 60. A second wiring line layer UM2 may be disposed on the second dielectric layer 62. A plurality of first wiring lines 70 may be disposed in the first wiring line layer UM1. A wiring inhibition interval ZR according to the disclosure may be defined or disposed in the first wiring line layer UM1. A plurality of second wiring lines 72 may be disposed in the second wiring line layer UM2.

Contacts 80 which pass through the first dielectric layer 60 may be formed to couple the logic circuit 50 and the first wiring lines 70. Contacts 82 which pass through the second dielectric layer 62 may be formed to couple the first wiring lines 70 and the second wiring lines 72.

Figure 16:
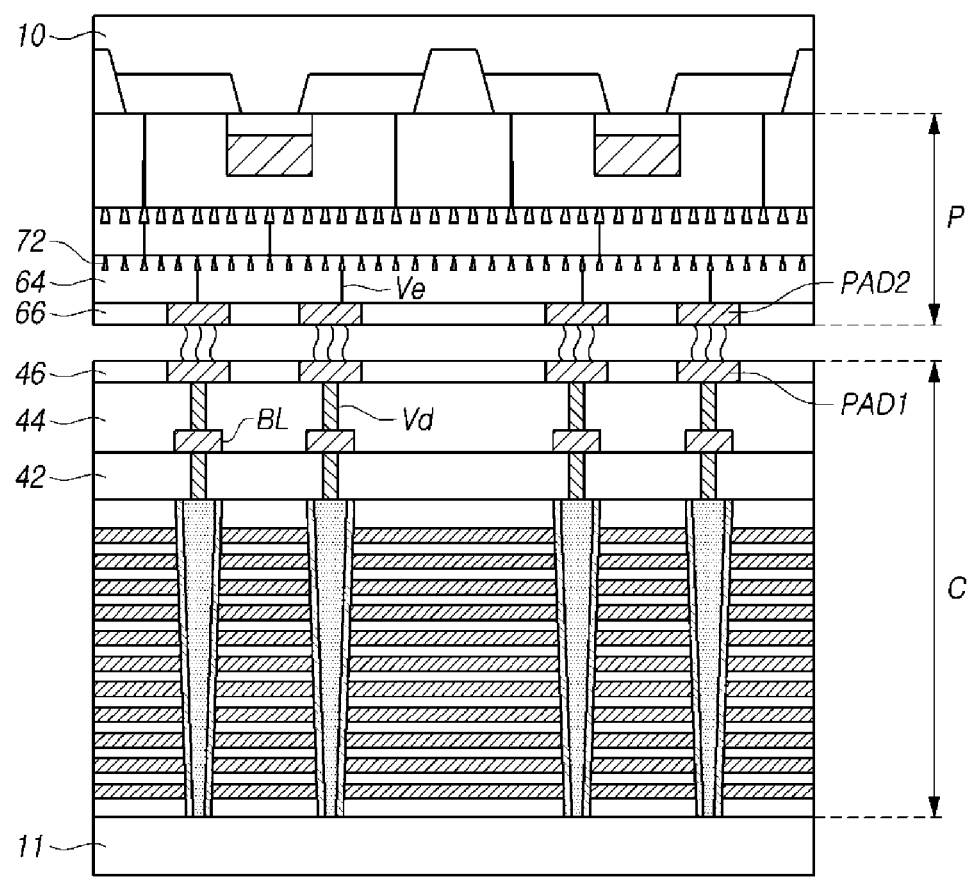
FIG. 16 is a cross-sectional view illustrating an example of a semiconductor memory device in accordance with an embodiment of the disclosure.

FIG. 16 is a cross-sectional view illustrating an example of a semiconductor memory device in accordance with embodiments of the disclosure.

Referring to FIG. 16, the semiconductor memory device may have a POC (peri over cell) structure. In other words, a logic structure P may be disposed over a memory structure C.

The memory structure C and the logic structure P may be fabricated on different wafers and then be bonded with each other. The memory structure C may be fabricated on a source plate 11. The logic structure P may be fabricated on a substrate 10. The substrate 10 and the source plate 11 may be formed of the same material. The substrate 10 and the source plate 11 may include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer.

A dielectric layer 44 may be formed on a dielectric layer 42 to cover bit lines BL. While FIG. 16 illustrates only the bit lines BL, a plurality of wiring lines including wiring lines coupled to electrode layers 20 may be defined or disposed on the dielectric layer 42, and the wiring lines may be covered by the dielectric layer 44. Pads PAD1 which are coupled to the bit lines BL and the wiring lines through vertical vias Vd may be defined or disposed on the dielectric layer 44. A dielectric layer 46 may be formed on the dielectric layer 44 to cover the side surfaces of the pads PAD1 and expose the top surfaces of the pads PAD1.

Pads PAD2 may be defined or disposed on a third dielectric layer 64 of the logic structure P. The pads PAD2 may correspond to the pads PAD1 of the memory structure C. Vertical vias Ve which pass through the dielectric layer 64 may be formed under the pads PAD2 to couple the pads PAD2 and second wiring lines 72. A dielectric layer 66 may be defined or disposed on the dielectric layer 64 to cover the side surfaces of the pads PAD2 and expose the top surfaces of the pads PAD2.

The memory structure C may be bonded onto the logic structure P, and thereby, the pads PAD2 of the logic structure P and the pads PAD1 of the memory structure C may be coupled with each other. Accordingly, electrical paths which couple the memory cells of the memory structure C and the logic circuit of the logic structure P may be formed.

Figure 17:
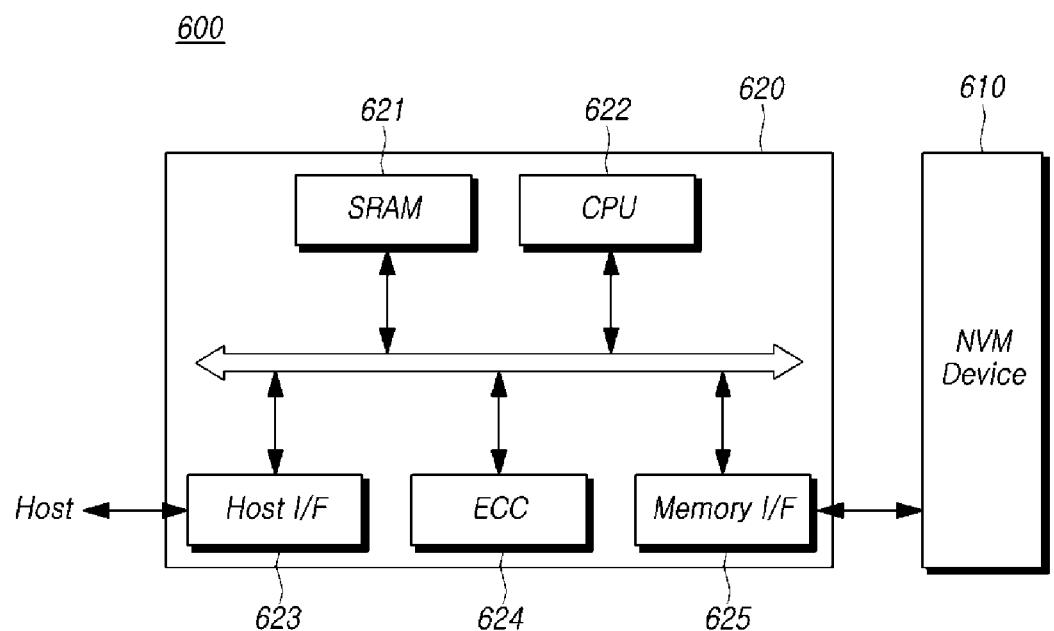
FIG. 17 is a diagram schematically illustrating a memory system including a semiconductor memory device in accordance with an embodiment of the disclosure.

FIG. 17 is a simplified block diagram schematically illustrating a memory system including a semiconductor memory device according to an embodiment of the present disclosure.

Referring to FIG. 17, the memory system 600 may include the nonvolatile memory device 610 and a memory controller 620.

The nonvolatile memory device 610 may be comprised of a nonvolatile memory device according to an embodiment of the disclosure as described above, and may be operated in the manner described above.

The memory controller 620 may control the nonvolatile memory device 610. For example, the combination of the nonvolatile memory device 610 and the memory controller 620, may be configured as a memory card or a solid state disk (SSD). The memory controller 620 may include an SRAM 621, a central processing unit (CPU) 622, a host interface 623, an ECC block 624, a memory interface 625.

The SRAM 621 may be used as the working memory of the CPU 622. The host interface 623 may include the data exchange protocol of a host which may be coupled with the memory system 600.

The ECC block 624 may detect and correct an error included in the data read out from the nonvolatile memory device 610.

The memory interface 625 may interface with the nonvolatile memory device 610. The CPU 622 may perform general control operations for data exchange of the memory controller 620.

Although not shown, it should become apparent to a person skilled in the art that the memory system 600 may further be provided with a ROM which stores code data for interfacing with the host. The nonvolatile memory device 610 may be provided as a multi-chip package constructed by a plurality of flash memory chips.

The memory system 600 may be used as a storage medium of high reliability having a low probability of an error occurring. The aforementioned nonvolatile memory device may be provided for a memory system such as a solid state disk (SSD). The memory controller 620 may communicate with an external device (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (integrated device electronics) protocol and the like.

Figure 18:
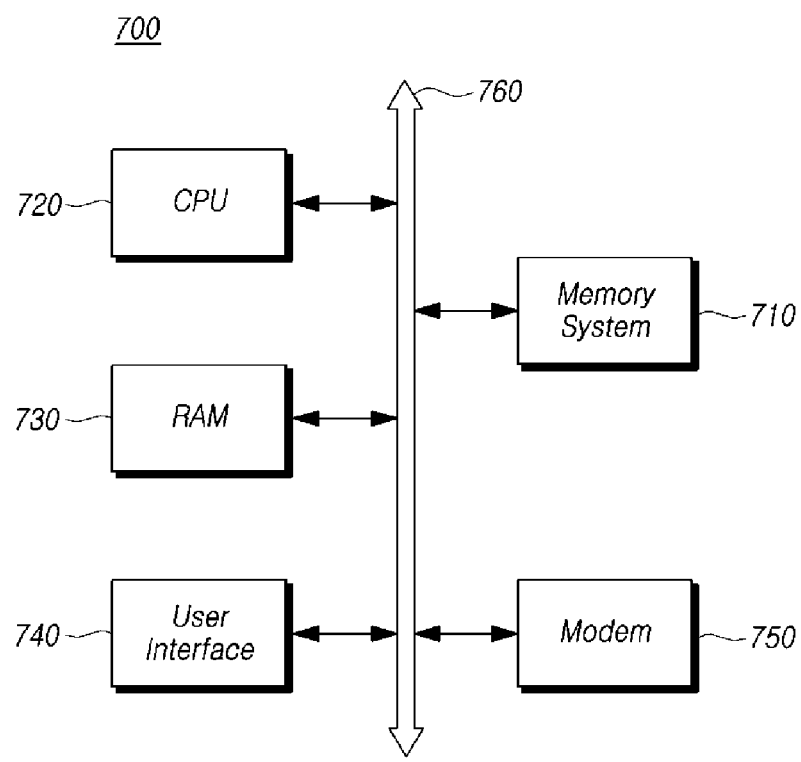
FIG. 18 is a block diagram schematically illustrating an example of a computing system including a semiconductor memory device in accordance with an embodiment of the disclosure.

FIG. 18 is a simplified block diagram schematically illustrating a computing system including a semiconductor memory device, according to an embodiment of the present disclosure.

Referring to FIG. 18, a computing system 700 according to an embodiment may include a memory system 710, a microprocessor (or CPU) 720, a RAM 730, a user interface 740, a modem 750 such as a baseband chipset, and, which are electrically coupled to a system bus 760. In an embodiment, the computing system 700 may be a mobile device, in which case a battery (not shown) for supplying the operating voltage of the computing system 700 may be additionally provided. Although not shown in the drawing, it should become apparent to a person skilled in the art that the computing system 700 may further comprise an application chipset, a COMS image sensor (CIS), a mobile DRAM, and so on. The memory system 710 may be configured, for example, as an SSD (solid state drive/disk) which uses a nonvolatile memory to store data. Also, as an example, the memory system 710 may be provided as a fusion flash memory (for example, a NAND or a NOR flash memory).

While various embodiments have been described above, it will be understood to those skilled in the art that the embodiments described are by way of example only. Accordingly, the semiconductor memory device described herein should not be limited based on the described embodiments.

What is claimed is:

1. A semiconductor memory device comprising:
   a plurality of memory cell arrays accessed through a plurality of row lines and a plurality of bit lines;
   a pass transistor coupled to one of the plurality of row lines and configured to transfer an operating voltage to the one of the plurality of row lines; and
   a plurality of wiring lines disposed in a wiring line layer over the pass transistor,
   wherein the wiring line layer comprises a wiring inhibition interval which overlaps a source and a drain of the pass transistor,
   wherein one or more of the plurality of wiring lines is disposed outside of the wiring inhibition interval.

2. The semiconductor memory device according to claim 1, further comprising:
   a first contact coupled to the source of the pass transistor; and
   a second contact coupled to the drain of the pass transistor,
   wherein the wiring inhibition interval overlaps the source and the drain between the first contact and the second contact.

3. The semiconductor memory device according to claim 1, wherein the wiring inhibition interval does not overlap with a gate of the pass transistor.

4. The semiconductor memory device according to claim 1, wherein the wiring inhibition interval does not overlap with a gate of the pass transistor and a gate spacer disposed on a sidewall of the gate.

5. The semiconductor memory device according to claim 1, wherein the wiring inhibition interval overlaps with a gate of the pass transistor and a gate spacer disposed on a sidewall of the gate.

6. The semiconductor memory device according to claim 1, wherein the plurality of wiring lines are not disposed in the wiring inhibition interval.

7. The semiconductor memory device according to claim 1,
wherein the plurality of wiring lines comprise a plurality of dummy wiring lines, and
wherein the plurality of dummy wiring lines are disposed in the wiring inhibition interval.

8. The semiconductor memory device according to claim 7, wherein a pattern density of the wiring lines outside the wiring inhibition interval is same as a pattern density of the dummy wiring lines in the wiring inhibition interval.

9. The semiconductor memory device according to claim 1,
wherein the memory cell arrays comprise a plurality of drain select transistors which are coupled to the plurality of bit lines, a plurality of source select transistors which are coupled to a plurality of source lines, and a plurality of memory cells which are coupled between the drain select transistors and the source select transistors,
wherein the plurality of row lines comprise a plurality of drain select lines which are coupled to gates of the drain select transistors, a plurality of source select lines which are coupled to gates of the source select transistors, and a plurality of word lines which are coupled to gates of the plurality of memory cells,
wherein the pass transistor is coupled to one of the source select lines and the drain select lines, and
wherein a wiring line to which a pass voltage is applied is disposed in the wiring inhibition interval.

10. The semiconductor memory device according to claim 1,
wherein the memory cell arrays comprise a plurality of drain select transistors which are coupled to the plurality of bit lines, a plurality of source select transistors which are coupled to a plurality of source lines, and a plurality of memory cells which are coupled between the drain select transistors and the source select transistors,
wherein the plurality of row lines comprise a plurality of drain select lines which are coupled to gates of the drain select transistors, a plurality of source select lines which are coupled to gates of the source select transistors, and a plurality of word lines which are coupled to gates of the plurality of memory cells,
wherein the pass transistor is coupled to one of the plurality of word lines, and
wherein the plurality of wiring lines that are coupled to the drain select lines and that are coupled to the source select lines are disposed outside of the wiring inhibition interval.

11. The semiconductor memory device according to claim 1,
wherein the memory cell arrays comprise a plurality of drain select transistors which are coupled to the plurality of bit lines, a plurality of source select transistors which are coupled to a plurality of source lines, and a plurality of memory cells which are coupled between the drain select transistors and the source select transistors,
wherein the plurality of row lines comprise a plurality of drain select lines which are coupled to gates of the drain select transistors, a plurality of source select lines which are coupled to gates of the source select transistors, and a plurality of word lines which are coupled to gates of the memory cells,
wherein the pass transistor is coupled to one of the plurality of word lines, and
wherein a wiring line that is coupled to a word line adjacent to a word line coupled to the pass transistor is disposed outside of the wiring inhibition interval.

12. A semiconductor memory device comprising:
a memory structure disposed on a first substrate, and comprising a plurality of memory cell arrays which are accessed through a plurality of row lines and a plurality of bit lines; and
a logic structure disposed on a second substrate, and comprising a logic circuit which comprises a pass transistor coupled to one of the plurality of row lines and transferring an operating voltage to the one of the plurality of row lines and a plurality of wiring lines disposed in a wiring line layer over the logic circuit,
wherein the wiring line layer comprises a wiring inhibition interval which overlaps with a source and a drain of the pass transistor and excludes at least one of the wiring lines.

13. The semiconductor memory device according to claim 12, wherein the first substrate is disposed over the logic structure.

14. The semiconductor memory device according to claim 12,
wherein the memory structure comprises a plurality of first pads which are coupled to the memory cell arrays,
wherein the logic structure comprises a plurality of second pads which are coupled to the logic circuit, and
wherein the memory structure and the logic structure are bonded with each other such that the first pads and the second pads are coupled with each other.

15. The semiconductor memory device according to claim 12, wherein the logic structure further comprises a dielectric layer which covers the logic circuit, and the wiring line layer is disposed on the dielectric layer.

16. The semiconductor memory device according to claim 15, further comprising:
a first contact coupled to the source of the pass transistor through the dielectric layer; and
a second contact coupled to the drain of the pass transistor through the dielectric layer,
wherein the wiring inhibition interval is disposed between the first contact and the second contact.

17. The semiconductor memory device according to claim 12, wherein the wiring lines are not disposed in the wiring inhibition interval.

18. The semiconductor memory device according to claim 12, wherein the wiring lines comprise a plurality of dummy wiring lines, and the dummy wiring lines are disposed in the wiring inhibition interval.

19. The semiconductor memory device according to claim 12,
wherein the memory cell arrays comprise a plurality of drain select transistors which are coupled to the plurality of bit lines, a plurality of source select transistors which are coupled to a plurality of source lines, and a plurality of memory cells which are coupled between the drain select transistors and the source select transistors, wherein the row lines comprise a plurality of drain select lines which are coupled to gates of the drain select transistors and a plurality of source select lines which are coupled to gates of the source select transistors, wherein the pass transistor is coupled to one of the source select lines and the drain select lines, and wherein disposition of only a wiring line to which a pass voltage is applied is permitted in the wiring inhibition interval.

20. The semiconductor memory device according to claim 12, wherein the memory cell arrays comprise a plurality of drain select transistors which are coupled to the plurality of bit lines, a plurality of source select transistors which are coupled to a plurality of source lines, and a plurality of memory cells which are coupled between the drain select transistors and the source select transistors, wherein the row lines comprise a plurality of drain select lines which are coupled to gates of the drain select transistors, a plurality of source select lines which are coupled to gates of the source select transistors, and a plurality of word lines which are coupled to gates of the memory cells, wherein the pass transistor is coupled to one of the plurality of word lines, and wherein wiring lines which are coupled to the drain select lines and wiring lines which are coupled to the source select lines are excluded from the wiring inhibition interval.

21. The semiconductor memory device according to claim 12, wherein the memory cell arrays comprise a plurality of drain select transistors which are coupled to the plurality of bit lines, a plurality of source select transistors which are coupled to a plurality of source lines, and a plurality of memory cells which are coupled between the drain select transistors and the source select transistors, wherein the row lines comprise a plurality of drain select lines which are coupled to gates of the drain select transistors, a plurality of source select lines which are coupled to gates of the source select transistors, and a plurality of word lines which are coupled to gates of the memory cells, wherein the pass transistor is coupled to one of the plurality of word lines, and wherein wiring line which is coupled to a word line adjacent to a word line coupled to the pass transistor is excluded from the wiring inhibition interval.

* * * * *